(12) United States Patent
Sagron et al.

(10) Patent No.: US 11,348,643 B2
(45) Date of Patent: May 31, 2022

(54) IDENTIFYING FAILURE TYPE IN NVM PROGRAMMED IN SLC MODE USING A SINGLE PROGRAMMING PULSE WITH NO VERIFICATION

(71) Applicant: Apple Inc., Cupertino, CA (US)

(72) Inventors: Itay Sagron, Gedera (IL); Assaf Shappir, Ganey Tikva (IL)

(73) Assignee: APPLE INC., Cupertino, CA (US)

(*) Notice: Subject to any disclaimer, the term of this patent is extended or adjusted under 35 U.S.C. 154(b) by 199 days.

(21) Appl. No.: 16/799,874

(22) Filed: Feb. 25, 2020

(65) Prior Publication Data

US 2021/0264980 A1    Aug. 26, 2021

(51) Int. Cl.
| | |
|---|---|
| *G11C 16/34* | (2006.01) |
| *G11C 16/10* | (2006.01) |
| *G06F 11/10* | (2006.01) |
| *G11C 16/26* | (2006.01) |
| *G11C 16/04* | (2006.01) |

(52) U.S. Cl.
CPC .......... *G11C 16/10* (2013.01); *G06F 11/1068* (2013.01); *G11C 16/26* (2013.01); *G11C 16/3459* (2013.01); *G11C 16/0483* (2013.01)

(58) Field of Classification Search
CPC ..... G11C 16/10; G11C 16/26; G11C 16/3459; G11C 16/0483; G11C 2029/0411; G11C 29/4401; G11C 29/74; G11C 2029/0409; G11C 29/52; G06F 11/1068; G06F 2201/81; G06F 11/073; G06F 11/076; G06F 11/0793

USPC .......................................................... 714/764
See application file for complete search history.

(56) References Cited

U.S. PATENT DOCUMENTS

| | | | | |
|---|---|---|---|---|
| 5,428,621 | A * | 6/1995 | Mehrotra | G11C 29/02 714/711 |
| 5,764,568 | A * | 6/1998 | Chevallier | G11C 11/5621 365/185.03 |
| 7,924,587 | B2 | 4/2011 | Perlmutter et al. | |
| 8,493,781 | B1 | 7/2013 | Meir et al. | |
| 8,566,671 | B1 * | 10/2013 | Ye | G11C 29/42 714/764 |
| 9,666,286 | B2 | 5/2017 | Lee | |

(Continued)

*Primary Examiner* — Albert Decady
*Assistant Examiner* — Enam Ahmed
(74) *Attorney, Agent, or Firm* — Kligler & Associates Patent Attorneys Ltd

(57) ABSTRACT

A controller includes an interface and storage circuitry. The interface is configured to communicate with a memory device that includes multiple memory cells organized in memory blocks. The memory device supporting programming of the memory cells with enabled or disabled program-verification. The storage circuitry is configured to disable the program-verification, and program data to a group of the memory cells in a Single Level Cell (SLC) mode using a single programming pulse, to read the data from the group of the memory cells. In response to detecting a failure in reading the data, the storage circuitry is configured to distinguish between whether the memory cells in the group belong to a defective memory block or were under-programmed, and when identifying that the memory cells in the group were under-programmed, to perform a corrective action to prevent under-programming in subsequent program operations to the memory cells in the group.

24 Claims, 5 Drawing Sheets

(56) References Cited

U.S. PATENT DOCUMENTS

| | | | |
|---|---|---|---|
| 9,703,494 B1 | 7/2017 | Rajwade et al. | |
| 10,109,361 B1 | 10/2018 | Khakifirooz et al. | |
| 2005/0057995 A1* | 3/2005 | Mitani | G11C 11/56 |
| | | | 365/222 |
| 2012/0281479 A1* | 11/2012 | Kochar | G11C 29/025 |
| | | | 365/185.19 |
| 2015/0212883 A1* | 7/2015 | Chen | G11C 16/26 |
| | | | 714/764 |
| 2015/0220391 A1* | 8/2015 | Chilappagari | G06F 11/1048 |
| | | | 714/764 |
| 2015/0378815 A1* | 12/2015 | Goda | G06F 11/1068 |
| | | | 714/764 |
| 2016/0077912 A1* | 3/2016 | Mateescu | G06F 11/1072 |
| | | | 714/764 |
| 2016/0098317 A1* | 4/2016 | Alhussien | H03M 13/2906 |
| | | | 714/764 |
| 2019/0180822 A1 | 6/2019 | Dunga et al. | |
| 2019/0272871 A1 | 9/2019 | Yang et al. | |
| 2020/0005873 A1 | 1/2020 | Yazovitsky et al. | |
| 2020/0005874 A1 | 1/2020 | Shappir et al. | |
| 2020/0225851 A1* | 7/2020 | Klein | G06F 3/0619 |
| 2021/0358553 A1* | 11/2021 | Yang | G11C 8/08 |

\* cited by examiner

IDENTIFYING FAILURE TYPE IN NVM PROGRAMMED IN SLC MODE USING A SINGLE PROGRAMMING PULSE WITH NO VERIFICATION

TECHNICAL FIELD

Embodiments described herein relate generally to data storage, and particularly to methods and systems for identifying failure type in nonvolatile memory programmed in SLC mode using a single programming pulse with no verification.

BACKGROUND

In modern storage systems, memory cells are typically programmed to store multiple bits of information per memory cell. In some storage systems, however, at least a portion of the memory cells are programmed to store a single bit of information per each memory cell, in which case, each memory cell is programmed to assume two possible programming levels. A storage mode of a single bit per memory cell is commonly known as a Single-Level Cell (SLC) mode.

Methods for programming memory cells in SLC mode are known in the art. For example, U.S. Patent Application Publication 2019/0272871 describes adjusting a programming setting such as a programming voltage of a set of nonvolatile storage cells, such as an SLC NAND array. The non-volatile storage cells may be arranged into a plurality of word lines. A subset of the non-volatile storage cells may be configured to store a programming setting. An on-die controller may be configured to read the programming setting from the setting subset, and write data to the non-volatile storage cells, using the programming setting. The on-die controller may further be configured to determine that the programming setting causes suboptimal programming of one or more of the non-volatile storage cells, and in response to the determination, store a revised programming setting on the setting subset.

SUMMARY

An embodiment that is described herein, provides a controller that includes an interface and storage circuitry. The interface is configured to communicate with a memory device that includes multiple memory cells organized in memory blocks. The memory device supporting programming of the memory cells with enabled or disabled program-verification. The storage circuitry is configured to disable the program-verification and program data to a group of the memory cells in a Single Level Cell (SLC) mode using a single programming pulse, to read the data from the group of the memory cells, in response to detecting a failure in reading the data, to distinguish between whether the memory cells in the group belong to a defective memory block or whether the memory cells in the group were under-programmed, and when identifying that the memory cells in the group were under-programmed, to perform a corrective action to prevent under-programming in subsequent program operations to the memory cells in the group.

In some embodiments, the storage circuitry is configured to check a number of bit-flip occurrences in the read data, to identify that the memory cells were under-programmed when the number of the bit-flip occurrences exceeds a first predefined number, and to identify that the memory cells in the group belong to a defective memory block when the number of the bit-flip occurrences exceeds a second predefined number larger than the first predefined number. In other embodiments, the storage circuitry is configured to count in the read data a first number of one-valued bits and a second number of zero-valued bits, and to identify that the memory cells in the group belong to a defective memory block when a balance measure between the first number and the second number exceeds a predefined balance threshold. In yet other embodiments, the storage circuitry is configured to estimate a threshold-voltage distribution by reading the memory cells in the group using multiple read thresholds, and to identify that the memory cells in the group were under-programmed when identifying two distinct peaks in the estimated threshold-voltage distribution.

In an embodiment, the storage circuitry is configured to identify pages that failed reading in a same memory block, and to identify that the memory cells in the group were under-programmed when a number of the failing pages in the same memory block is below a predefined number. In another embodiment, the memory blocks are organized in multiple planes, and the storage circuitry is configured to program the data across the multiple planes in parallel, to read the data from the group of memory cells in the multiple planes, and to identify that part of the memory cells in the group belong to a defective memory block in a respective plane, when reading the data fails only in the respective plane among the multiple planes. In yet another embodiment, the storage circuitry is configured to read from the memory cells in the group multiple code words that were encoded before storage in accordance with an Error Correction Code (ECC), and to identify that the memory cells in the group belong to a defective memory block when detecting that all of the multiple code words are undecodable or having a number of errors exceeding a predefined threshold number.

In some embodiments, the storage circuitry is configured to perform the corrective action by enabling the program-verification in subsequent program operations to the memory cells in the group. In other embodiments, the storage circuitry is configured to perform the corrective action by increasing an amplitude of the single programming pulse in subsequent program operations to the memory cells in the group. In yet other embodiments, in response to identifying that the memory cells in the group were under-programmed, the storage circuitry is configured to estimate a severity level of under-programming applied to the memory cells in the group, and to select the corrective action from among multiple predefined corrective action tasks, based on the severity of the under-programming.

In an embodiment, the storage circuitry is configured to estimate a failure rate in reading data from the group of the memory cells, and upon detecting that the failure rate exceeds a predefined rate, to enable the program-verification in subsequent program operations to the memory cells in the group. In another embodiment, the memory cells in the group belong to a stripe including multiple memory blocks in multiple respective planes, and the storage circuitry is configured to read the memory cells in the group across the multiple memory blocks of the stripe, and upon detecting a failure in reading the memory cells in a given memory block, to assign the given memory block to a stripe in which the memory cells are programmed with the program-verification enabled.

There is additionally provided, in accordance with an embodiment that is described herein, a method for data storage, including, in a controller that communicates with a memory device that includes multiple memory cells organized in memory blocks, the memory device supports programming the memory cells with enabled or disabled program-verification, disabling the program-verification, and programming data to a group of the memory cells in a Single Level Cell (SLC) mode using a single programming pulse. The data is read from the group of the memory cells. In response to detecting a failure in reading the data, the memory cells in the group are checked to distinguish whether the memory cells in the group belong to a defective memory block or whether the memory cells in the group were under-programmed, and when identifying that the memory cells in the group were under-programmed, a corrective action is performed to prevent under-programming in subsequent program operations to the memory cells in the group.

These and other embodiments will be more fully understood from the following detailed description of the embodiments thereof, taken together with the drawings in which:

DETAILED DESCRIPTION OF EMBODIMENTS

Overview

Figure 1:
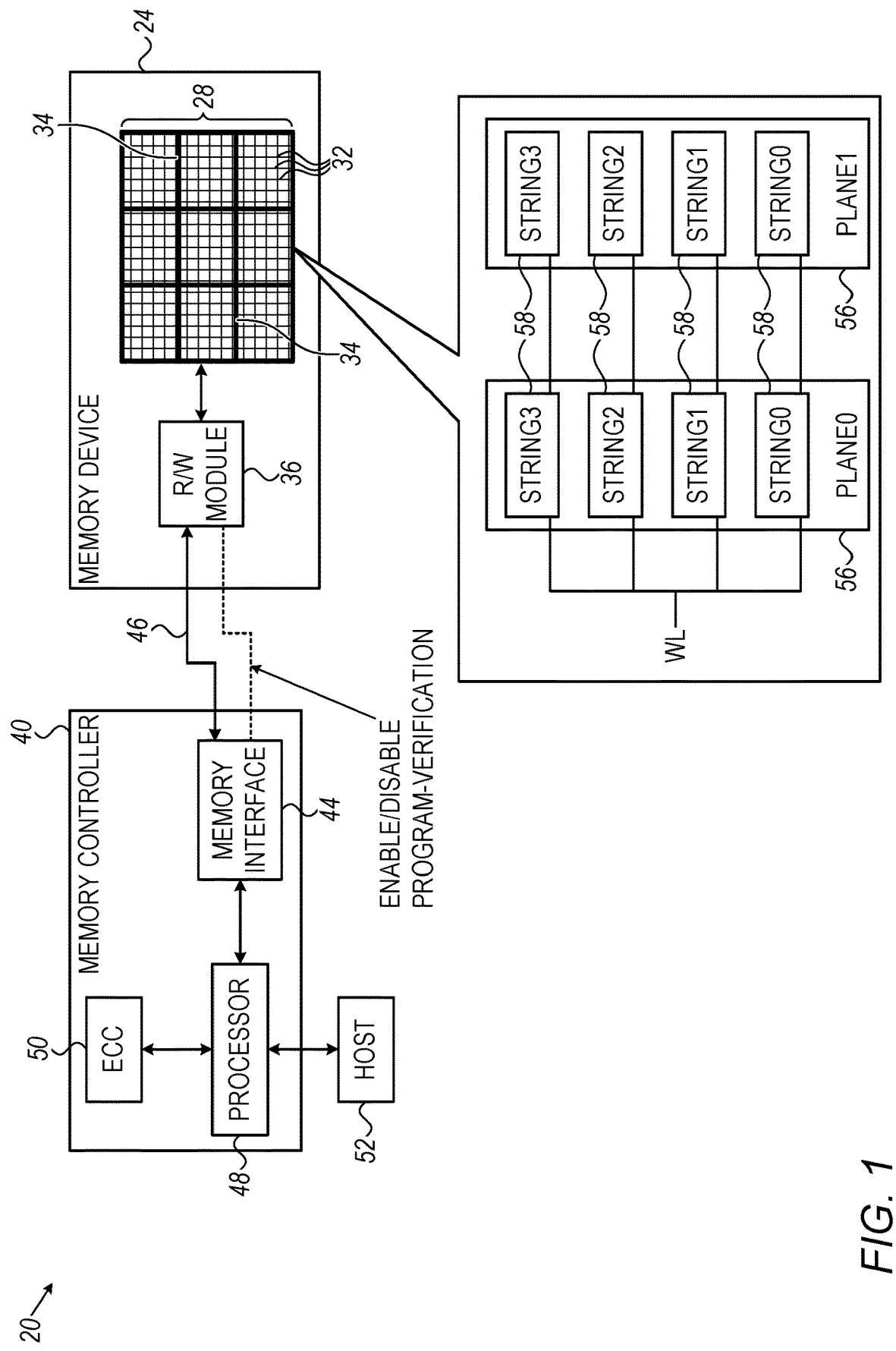
FIG. 1 is a block diagram that schematically illustrates a memory system, in accordance with an embodiment that is described herein.

Embodiments that are described herein provide systems and methods for identifying a failure type in a nonvolatile memory programmed in a Single Level Cell (SLC) mode using a single programming pulse with no verification.

A nonvolatile memory comprises multiple memory cells that may store data in different configurations. In SLC mode, each memory cell stores a single bit of information using two programming levels. In other storage modes such as, for example, a Multi-Level Cell (MLC) mode, a Triple-Level Cell (TLC) mode and a Quad-level Cell (QLC) mode, the storage capacities are 2 bit/cell, 3 bit/cell and 4 bit/cell, using four, eight and sixteen programming levels, respectively.

In programming data to a nonvolatile memory device, the memory device typically applies to relevant memory cells a sequence of programming pulses. Following a programming pulse, the memory device identifies memory cells that have already reached the designated programming levels and inhibits them from receiving subsequent programming pulses. The programming process continues until all the relevant memory cells have reached their designated levels within a limit number of programming pulses, or otherwise the program operation fails. Reading data stored in the memory device is typically much faster than data programming because a reading operation typically requires a single sensing operation to the memory cells. In some cases, a program operation that includes verification may be on the order of ten times slower than a read operation. This results in an unbalanced performance, in terms of speed and power consumption, between programming and reading operations.

In some embodiments, at least some of the memory cells are programmed in SLC mode. Programming data in SLC mode is typically faster than in other modes such as MLC, TLC and QLC. Moreover, the SLC mode is more reliable than the higher capacity storage modes because only two programming levels need to be distinguished. In some embodiments, the memory device stores data received for programming in an intermediate buffer in SLC mode, which is also referred to as "a SLC buffer." Moreover, critical data such as certain tables and system-related information may be stored in SLC mode for increased reliability.

One approach to achieve faster programming in SLC mode, is to reduce the number of programming pulses used. This, however, may undesirably reduce the accuracy in programming the memory cells to the correct nominal SLC programming level. For example, programming the memory cells to a level lower than the nominal SLC level is referred to as "under-programming," which may result in a high error rate upon reading. Programming the memory cells to a level higher than the nominal SLC level may cause stress to the memory cells and possibly damage them or shorten their lifetime.

In some embodiments, for fast programming in SLC mode, the memory device applies only a single programming pulse. In some disclosed embodiments, the memory device supports programming in SLC mode with program-verification enabled or disabled. When program-verification is enabled, the memory device checks and reports a status indicative of whether the program operation has succeeded or failed. When program-verification is disabled, the memory device omits verification following the programming pules, which mode is much faster but less reliable. Programming in SLC mode without performing the verification phase is also referred to herein as "blind SLC programming."

Since in blind SLC programming the program-verification phase is skipped, data may be stored erroneously. In some embodiments, data is stored along with temporary or persistent redundancy information that allows recovering data whose reading has failed. Example methods of this sort are described, for example, in U.S. patent application Ser. Nos. 16/202,127, and 16/202,130, both filed Nov. 28, 2018.

During the memory device lifetime, the memory device may suffer from recoverable and unrecoverable failures. A recoverable failure may be defeated by taking a suitable corrective action, e.g., modifying one or more operational parameters. In an unrecoverable failure the performance of at least some memory cells may degrade below an unacceptable level, which makes these memory cells unusable. An unrecoverable failure may be caused, for example, by an impairment such as WL-to-WL or WL-to-substrate short or leakage, caused at manufacture time or occurring during operation. For example, the memory cells typically support a limited number of programming and erasure operations, after which they may be retired. Alternatively, memory cells (e.g., in memory blocks) may be further used after hitting the official limit of programming and erasure cycles, when the failure rate is still acceptable.

As will be described in detail below, a controller that manages the memory device seeks to determine whether a failure in reading data that was programmed in SLC mode using a single programming pulse without program-verification is caused by a defective memory block, which is unrecoverable, or due to under-programming which in many cases may be recoverable and mitigated, e.g., by modifying programming parameters in subsequent programming operations.

Consider a controller, comprising an interface and storage circuitry. The controller communicates via the interface with a memory device comprising multiple memory cells organized in memory blocks. The memory device supports programming of the memory cells with enabled or disabled program-verification. The storage circuitry disables the program-verification and programs data to a group of the memory cells in a Single Level Cell (SLC) mode using a single programming pulse. The storage circuitry later reads the data from the group of the memory cells, and in response to detecting a failure in reading the data, distinguishes between whether the memory cells in the group belong to a defective memory block or whether the memory cells in the group were under-programmed. When identifying that the memory cells in the group were under-programmed, the storage circuitry performs a corrective action to prevent under-programming in subsequent program operations to the memory cells in the group.

The storage circuitry may distinguish between whether the memory cells in the group belong to a defective memory block or whether the memory cells in the group were under-programmed in various ways as described herein. In some embodiments, the storage circuitry checks the number of bit-flip occurrences in the read data, identifies that the memory cells were under-programmed when the number of the bit-flip occurrences exceeds a first predefined number, and identifies that the memory cells in the group belong to a defective memory block when the number of the bit-flip occurrences exceeds a second predefined number larger than the first predefined number. In other embodiments, the storage circuitry counts in the read data a first number of one-valued bits and a second number of zero-valued bits, and identifies that the memory cells in the group belong to a defective memory block when a balance measure between the first number and the second number exceeds a predefined balance threshold. In an embodiment, the storage circuitry estimates a threshold-voltage distribution by reading the memory cells in the group using multiple read thresholds, and identifies that the memory cells in the group were under-programmed when identifying two distinct peaks (corresponding to the two SLC programming levels) in the estimated threshold-voltage distribution. In another embodiment, the storage circuitry counts the number of pages that failed reading in a same memory block, and identifies that the memory cells in the group were under-programmed when the number of the failing pages in the same memory block is below a predefined number.

In some embodiments, the memory blocks in a given die are organized in multiple planes that the controller may access in parallel. In these embodiments, the storage circuitry programs the data across the multiple planes of the die in parallel. The storage circuitry reads the data from the group of memory cells in the multiple planes, and identifies that part of the memory cells in the group belong to a defective memory block in a respective plane, when reading the data fails only in the respective plane among the multiple planes.

In an embodiment, the controller reads from the memory cells in the group multiple code words that were encoded before storage in accordance with an Error Correction Code (ECC), and identifies that the memory cells in the group belong to a defective memory block when detecting that all of the multiple code words are undecodable or having a number of errors exceeding a predefined threshold number.

The controller may perform any suitable corrective action. In an example embodiment, the storage circuitry performs the corrective action by enabling the program-verification in subsequent program operations to the memory cells in the group. In another embodiment, the storage circuitry performs the corrective action by increasing an amplitude of the single programming pulse in subsequent program operations to the memory cells in the group. In yet another embodiment, in response to identifying that the memory cells in the group were under-programmed, the storage circuitry estimates a severity level of under-programming applied to the memory cells in the group, and selects the corrective action from among multiple predefined corrective action tasks, based on the severity of the under-programming.

In an embodiment, the storage circuitry estimates a failure rate in reading data from the group of the memory cells, and upon detecting that the failure rate exceeds a predefined rate, enables the program-verification in subsequent program operations to the memory cells in the group.

In some embodiments, the memory cells in the group belong to a stripe comprising multiple memory blocks in multiple respective planes. In such embodiments, the storage circuitry reads the memory cells in the group across the multiple memory blocks of the stripe, and upon detecting a failure in reading the memory cells in a given memory block, assigns the given memory block to a stripe in which the memory cells are programmed with the program-verification enabled.

In the disclosed techniques, memory cells are programmed in SLC mode using a single programming pulse with no program-verification. This allows fast and low-power consumption in program operations. When a failure occurs in reading the memory cells, a controller identifies the failure type and acts accordingly. Specifically, the controller distinguishes between an unrecoverable failure of defective memory blocks, and a recoverable failure of under-programming. The controller may apply a corrective action in an attempt to prevent under-programming in subsequent program operations, or to selectively perform program-verification. By using the disclosed techniques, fast blind SLC programming is applied when possible. This reduces programming delay and power consumption, which is important in programming data bursts. Moreover, balanced operation between read and program is achieved.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 comprises a Non-Volatile Memory (NVM) device 24, which stores data in a memory array 28 that comprises multiple memory cells 32, such as analog memory cells. The memory cells are arranged in multiple memory blocks 34. In the context of the present patent application, the term "analog memory cell" is used to describe any memory cell that holds a continuous, analog value of a physical parameter, such as an electrical voltage or charge. Memory array 28 may comprise solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Magneto-resistive Random-Access Memory (MRAM), Ferroelectric RAM (FRAM) or Resistive RAM (RRAM). Although the embodiments described herein refer mainly to analog memory, the disclosed techniques may also be used with various other memory types.

The charge levels stored in the memory cells and/or the analog voltages or currents written into and read out of the memory cells are referred to herein collectively as analog values, storage values or analog storage values. Although the embodiments described herein mainly address threshold voltages, the methods and systems described herein may be used with any other suitable kind of storage values. In the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell device and a 4 bit/cell device, also referred to as a Triple-Level Cell (TLC) and Quad-Level Cell (QLC), can be programmed to assume one of eight and one of sixteen possible programming levels, respectively. A memory cell that stores a single bit (i.e., using two programming levels) is also referred to as a Single-Level Cell (SLC).

Memory device 24 comprises a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the memory cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds. In some embodiments, the R/W module supports setting read thresholds only within a predefined range of voltages.

Memory system 20 comprises a memory controller 40 that performs storage and retrieval of data in and out of memory device 24. Memory controller 40 comprises a memory interface 44 for communicating with memory device 24, a processor 48, and an Error Correction Code (ECC) module 50. Memory controller 40 communicates with memory device 24 via memory interface 44 over a communication link 46. Communication link 46 may comprise any suitable communication link or bus, such as, for example, a PCIe bus.

In some embodiments, memory controller 40 communicates with memory device 24 storage commands such as erase, program and read commands. The memory controller may communicate with the memory device control commands, e.g., for configuring read thresholds. Other control commands comprise, for example, configuring the programming process, such as setting the maximum number of programming pulses to apply, and a command for enabling or disabling program-verification in programming in SLC mode using a single programming pulse. The disclosed techniques can be carried out by memory controller 40, by R/W module 36, or both. Thus, in the present context, memory controller 40 and R/W module 36 are referred to collectively as "storage circuitry" that carries out the disclosed techniques.

Memory controller 40 communicates with a host 52, for accepting data for storage in the memory device and for outputting data retrieved from the memory device. In some embodiments, ECC module 50 encodes the data for storage using a suitable ECC and decodes the ECC of data retrieved from the memory. ECC module 50 may comprise any suitable type of ECC, such as, for example, Low Density Parity Check (LDPC), Reed-Solomon (RS) or Bose-Chaudhuri-Hocquenghem (BCH), can be used. The word produced by the ECC encoder in a single encoding operation, in accordance with the rules defining the underlying code, is also referred to as a code word (CW).

Data read from a group of memory cells may contain one or more errors. The number of errors typically increases when the read threshold used for sensing the memory cells is positioned non-optimally. A read operation fails, for example, when the number of errors in the read data exceeds the ECC capabilities.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor such as processor 48 or other element of the host system. In some embodiments, host 52 and memory controller 40 may be fabricated on the same die, or on separate dies in the same device package.

In some embodiments, processor 48 of memory controller comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell 32 comprises a floating-gate transistor. The gates of the transistors in each row are connected by word lines (WLs), and the sources of the transistors in each column are connected by bit lines (BLs). The memory array is typically divided into multiple memory pages, i.e., groups of memory cells that are programmed and read simultaneously.

Memory cells are often programmed in an iterative Program and Verify (P&V) process that (i) applies a sequence of programming pulses to the memory cells, and (ii) verifies the analog values of the memory cells following each pulse (or some of the pulses). Memory cells that have reached their intended programming levels are inhibited from receiving subsequent programming pulses.

In some embodiments, R/W module 36 programs data to a group of memory cells by applying to the memory cells a single programming pulse. In some embodiments, the memory device supports enabling or disabling the program-verification phase. In these embodiments, processor 48 sends to the memory device, via communication link 46, a command to enable or disable the program-verification phase in programming selected memory blocks. Specifically, memory controller 40 may disable the program-verification phase when programming a group of the memory cells in SLC mode using a single programming pulse.

In some embodiments, memory cells 32 are arranged in multiple sub-arrays referred to as "planes" 56. In this configuration each WL is shared among multiple planes. In the example of FIG. 1, the memory cells are arranged in two planes denoted PLANE0 and PLANE1. In some embodiments, memory controller 40 may program data to and read data from multiple planes, in parallel, using a respective multi-plane program or read command.

In the example of FIG. 1, the memory cells are arranged in a Three-Dimensional (3D) configuration. In such embodiments, the memory cells are arranged in multiple strings 58, wherein each word line comprises memory cells of multiple different strings. In the example, of FIG. 1, each of planes 56 comprises four strings 58 denoted STRING0 . . . STRING3.

In some embodiments, memory pages are sub-divided into sectors. Data pages may be mapped to word lines in various manners. Each word line may store one or more data pages. A given data page may be stored in all the memory cells of a word line, or in a subset of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may comprise thousands of erasure blocks, also referred to as "memory blocks" 34. In a typical two-dimensional (2D) two-bit-per-cell MLC device, each erasure block is on the order of 128 word lines, each comprising several tens of thousands of memory cells. Two-bit-per-cell devices having 128 word lines per erasure block that store a data page per bit-significance value would have 256 data pages per erasure block, and three-bit-per-cell devices would have 384 data pages per block. A typical three-dimensional (3D) device that stores three bits per cell may comprise, for example, 4 strings per block, wherein each string comprises several thousand layered columns that each comprises 48 layers of cell columns. Such a 3D device has 12 data pages per a physical word line, or 576 data pages per an erasure block. Alternatively, other block sizes and configurations can also be used.

Threshold-Voltage Distributions in SLC Mode

Figure 2:
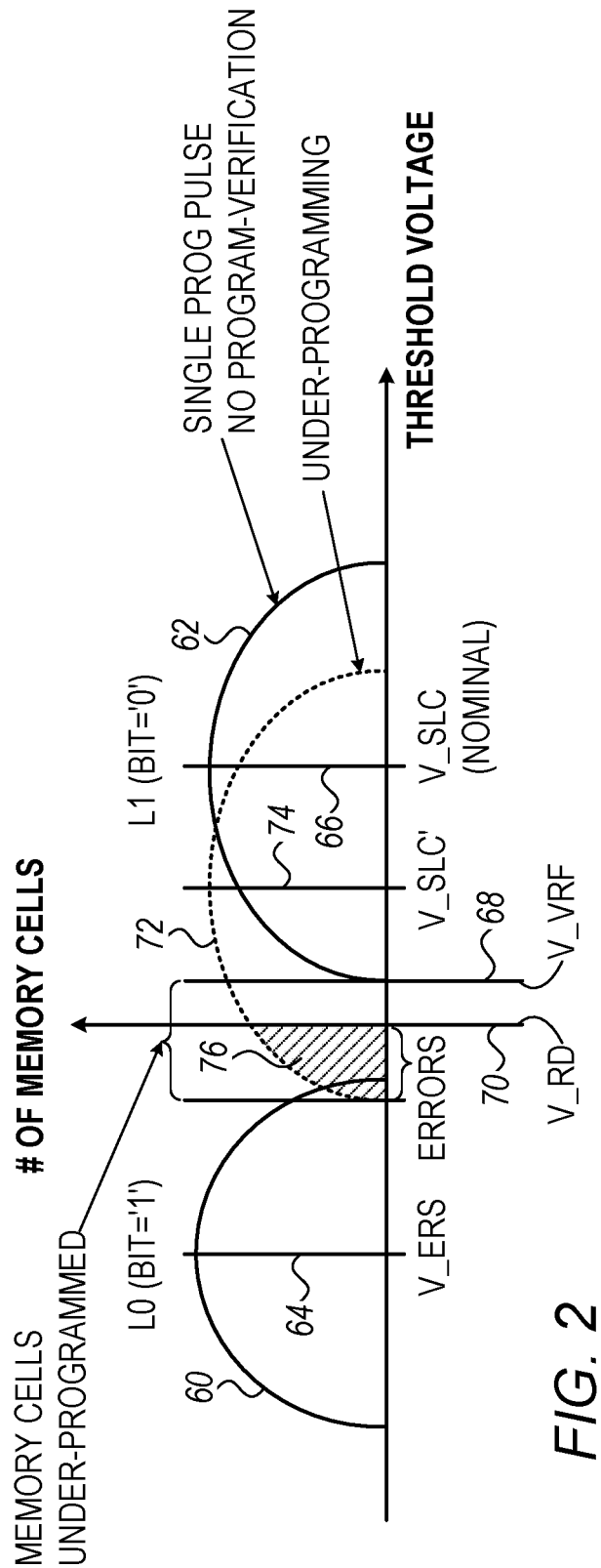
FIG. 2 is a diagram that schematically illustrates threshold-voltage distributions related to memory cells programmed in SLC mode, in accordance with an embodiment that is described herein.

FIG. 2 is a diagram that schematically illustrates threshold-voltage distributions related to memory cells programmed in SLC mode, in accordance with an embodiment that is described herein.

In SLC mode, memory cells 32 are programmed to assume two programming levels denoted L0 and L1 corresponding to respective threshold-voltage distributions 60 and 62. A threshold voltage 64 denoted V_ERS is a nominal erasure level corresponding to storing a binary value '1.' A threshold voltage 66 denoted V_SLC is a nominal programming level corresponding to storing a binary value '0' (in SLC mode).

In some embodiments, memory controller 40 enables program-verification in SLC mode in memory device 24. In this case, memory device 24, (e.g., using R/W module 36) verifies successful SLC programming by verifying that the threshold voltages of respective memory cells programmed to programming level L1 are above a suitable verification threshold 68 denoted V_VRF. In an embodiment, when program-verification is enabled and programming fails over a predefined number of programming pulses, the R/W module notifies a programming failure status to the memory controller, e.g., by communicating the programming failure status over communication link 46. Otherwise, programming succeeds within the predefined number of programming pulses, and the memory device reports to the controller a programming success status. When the controller programs data in SLC mode using a single programming pulse with no program-verification, the controller receives no indication of the number of memory cells reaching the designated level and/or whether the code word is likely to pass or fail decoding upon read.

To read data stored in a group of the memory cells in SLC mode, the R/W module sets a read threshold voltage 70 denoted V_RD. The R/W module senses the memory cells in the group and assigns bit values '0' and '1' to memory cells respectively sensed above and below V_RD.

In FIG. 2, a threshold-voltage distribution 72 depicted in a dotted line, corresponds to a situation in which some of the memory cells in the group were programmed to a level lower than V_VRF. In the present example, threshold-voltage distribution 72 is centered about a threshold voltage 74 denoted V_SLC', lower than the nominal threshold voltage V_SLC. The memory cells in the group that were programmed below V_VRF are referred to as "under-programmed" Memory cells. The severity level of under-programming increases, e.g., when threshold-voltage distribution 62 drifts to lower threshold voltages. For example, the severity level of under-programming increases with as area 76 increases.

In the example of FIG. 2, the lower tail of threshold-voltage distribution 72 crosses below V_RD, which means that memory cells that were programmed to a bit value '0' but are sensed below V_RD will erroneously read a bit-value '1'. Marked area 76 under threshold-voltage distribution 72 corresponds to memory cells that read erroneously due to the under-programming below V_RD.

The range of threshold voltages between V_RD and V_VRF comprises a reliability margin. A large reliability margin provides good immunity to various impairments that may cause readout errors and even ECC decoding failure. Impairments may be caused at production or developed over time, such as, for example, programming and reading at different temperatures, non-uniformities in the structure of the cell array, soft defects, threshold distributions drift, disturbances among neighbor memory cells and the like. Note that programming the memory cells significantly above V_VRF is undesirable, because the electrical current along a column of memory cells may be cut off and disrupt sensing circuits.

Excluding the program-verification phase when programming data to the memory device in SLC mode using a single programming pulse reduces the duration of the program operations significantly. This allows balanced duration program and read operations. On the other hand, with blind SLC programming, the controller remains unaware of whether the memory cells were programmed properly or were under-programmed, in which case memory cells that were programmed below V_RD will be read erroneously.

In the embodiments that will be described below, processor 48 of memory controller 40 programs data to a group of memory cells 32, in SLC mode using a single programming pulse and with the program-verification disabled. The memory controller later reads the data from the memory cells, and in response to detecting a failure in reading the data, distinguishes between whether the memory cells in the group belong to a defective memory block or whether the memory cells in the group were under-programmed. As will be described in detail below, the memory controller may perform various corrective actions to prevent under-programming the memory cells in subsequent program operations.

The memory controller may detect a failure in reading the data is various ways. For example, the memory controller detects the failure based on whether the read data was stored encoded (using ECC 50) and is decodable. Alternatively or additionally, the memory controller may estimate the number of errors in the read data and detect a failure when the number of errors exceeds a predefined threshold number.

Figure 3:
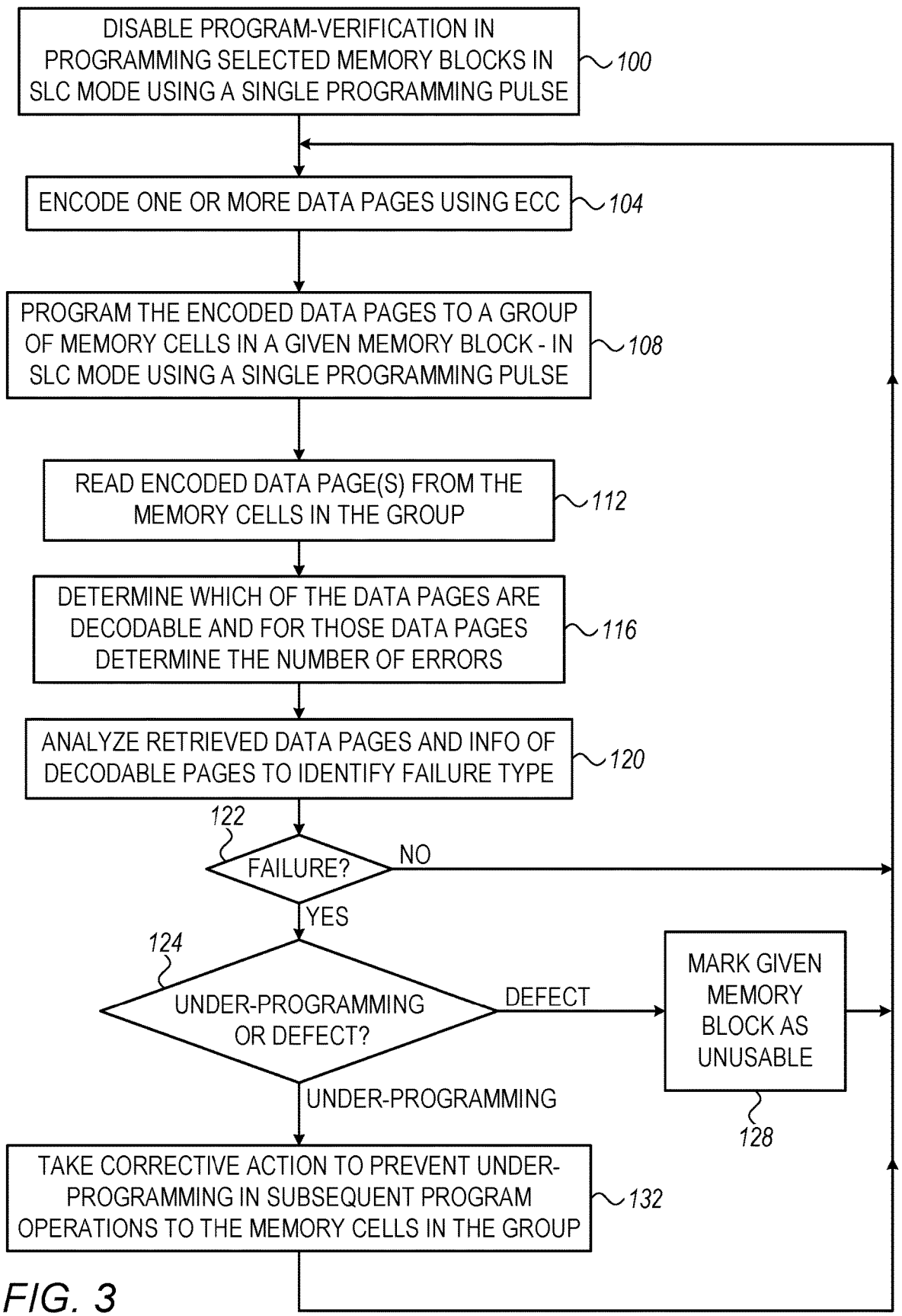
FIG. 3 is a flow chart that schematically illustrates a method for identifying a failure type in reading memory cells that were programmed in SLC mode using a single programming pulse, in accordance with an embodiment that is described herein.

Identifying a Failure Type in Blind SLC Programming Using a Single Programming Pulse FIG. 3 is a flow chart that schematically illustrates a method for identifying a failure type in reading memory cells that were programmed in SLC mode using a single programming pulse, in accordance with an embodiment that is described herein.

The method of FIG. 3 will be described as executed by processor 48 of memory controller 40 of FIG. 1.

The method begins with processor 48 disabling program-verification in SLC mode using a single programming pulse for one or more selected memory blocks, at a verification disabling step 100.

Memory controller 40 may enable or disable program-verification in programming the selected memory blocks using any suitable method. In the present example, the memory controller sends to the memory device, via communication link 46, a dedicated command that enables or disables program-verification for one or more selected memory blocks. Enable/disable program-verification may be carried out in any suitable storage granularity other than memory blocks, e.g., a granularity of WLs or pages. In alternative embodiments, the programing command itself contains a field specifying whether program-verification is enabled or disabled for that programming command. At a memory block granularity, a stripe of multiple memory blocks across multiple respective planes may be configured together to enable or disable program-verify. Program-verify at the WL or page granularity may be suitable, e.g., for NOR, specialty NAND, and PCM types of memory cells.

In some embodiments, processor 48 enables program-verify for one or more selected WLs in a memory block (e.g., in a regular NAND device). for example, the processor may enable program-verify in the first and/or last WLs in a memory block. A failure in programming the last WL in the memory block using a single programming pulse may be indicative of a leakage in that memory block. In this case, the processor may decide to check whether the WL and possibly other WLs in the memory block are decodable. As another example, the processor may detect a failure in programming the first WL of a memory block using a single pulse and when the failure is due to under-programming, apply early corrective actions. Note that checking two WLs out of about 100 WLs (100 as a nonlimiting example) of a memory blocks has no significant impact on the overall complexity.

At an encoding step 104, processor 48 encodes one or more data pages to be stored in memory device 24 using ECC module 50. A data page is read as a unit of data and may contain data encoded into one or more code words of the underlying ECC. At a programming step 108, processor 48 programs the encoded data pages to a group of memory cells (e.g., one or more WLs) in a given memory block among the selected memory blocks, in SLC mode using a single programming pulse. Since program-verification for the given memory block is currently disabled, memory device 24 stores the data in the memory cells of the group with no program-verification. Skipping the program-verification phase allows the controller to write data bursts to the memory device at a much higher throughput than when program-verification is enabled.

At a reading and decoding step 112, processor 48 reads the encoded data pages from the given memory block and decodes the read data pages using ECC module 50. In some embodiments, a data page that contains one or more code words is considered undecodable when at least one of the code words is undecodable. The data page is considered decodable when all of its code words are decodable.

At decodable checking step 116, the processor checks whether decoding the code words in each of the read data pages succeeds or fails, and for the data pages that were found decodable, determines the respective number of errors. For example, for a decodable data page, the ECC provides the number of errors that were corrected in each code word. In alternative embodiments, the controller has access to an error-free copy of the programmed data page and determines the number of errors in the read data page by comparing between the error-free copy and the data page. The processor may additionally collect information for the decodable data pages, regarding the complexity of the ECC methods required to succeed decoding.

In some embodiments, the processor uses the ECC complexity for deciding whether to refresh the memory block or mark it as a bad block (after copying the data e.g., to another memory block). For example, when the processor receives a failure indication immediately after programming, the processor may mark the memory block as a bad block. In some embodiments, the processor may decide that taking a corrective action may be sufficient, such as enabling program-verification, and attempts a corrective action before marking a bad block. In some embodiments, the decision also depends on program and erase (P/E) cycle count per memory block. A high bit-flip count may be caused due to reducing the voltage of the programming pulse after hitting a high P/E cycle count. The processor may therefore decide to ignore this high bit-flip count when this count is not too high (or enable program-verification). If the problem persists, the processor may attempt a corrective action such as re-increasing the voltage of the programming pulse or enable program-verification for the entire array.

In the example of FIG. 3, at step 120 the processor analyzes the read data pages and the information regarding decodable data pages in order to distinguish between two failure types. In one failure type, the memory cells in the group were under-programmed. In the other failure type, the given memory block is defective and should be retired. Example embodiments for distinguishing between the two failure types will be described in detail below.

At a failure checking step 122, processor 48 checks whether a readout failure occurred. For example, the processor may decide that no failure occurred (with high probability) when the read data pages are decodable, and the number of errors in the read data pages is below a predefined number. When the processor decides that no failure occurred, the method loops back to step 104 to encode subsequent data pages for storage. Otherwise processor 48 proceeds to a failure type checking step 124, at which processor 48 checks the failure type identified based on the analysis at step 120. In some embodiments, when at step 122 a failure occurs, the processor recovers lost data (e.g., data lost in one or more word lines or a in a memory block) using, for example, any suitable recovery scheme such as a Redundant Array of Independent Disks (RAID) scheme. The processor performs this data recovery phase independently on whether the failure is caused due to a defective memory block or under-programming.

When reading the data pages is likely to have failed because the given memory block is defective, processor 48 proceeds to a block retiring step 128, in which the processor marks the given memory block as unusable, and loops back to step 104. Alternatively, reading the data pages from the memory cells in the group is likely to have failed due to under-programming of the memory cells, and processor 48 proceeds to a corrective action application step 132.

At step 132, processor 48 applies a corrective action in an attempt to prevent under-programming in subsequent program operations to the memory cells in the group. The processor may apply any suitable corrective action. In some embodiments, the processor applies a corrective action by enabling the program-verification in subsequent program operations to the memory cells in the group. In other embodiments, the processor increases an amplitude of the single programming pulse in subsequent program operations to the memory cells in the group. This pushes the threshold-voltage distribution up toward the nominal V_SLC programming level.

In an embodiment, the processor holds multiple predefined corrective action tasks, suitable respectively for different severity levels of the under-programming. The processor estimates the severity level of the under-programming applied to the memory cells in the group and based on the estimated severity level selects a relevant corrective action from among the predefined corrective actions. In an embodiment, the processor estimates the severity level of the under-programming based on the number of errors, on whether the data pages are decodable or not, or both. In some embodiments, for decodable data pages or code words, the processor may estimate the severity level based on the number of bit-flip occurrences. In another embodiment, the processor estimates the severity level based on the position of the optimal read threshold, so that lower optimal read threshold may be indicative of higher severity level of the under-programming.

In another embodiment, the processor applies the corrective action by enabling program-verification in subsequent SLC program operations to the memory cells in the group.

When the severity level of the under-programming is low, the processor may apply a corrective action by increasing the programming voltage (when supported by the memory device). For higher under-programming severity levels, the processor may enable program-verification. When under-programming is extremely severe, the processor may mark the relevant memory block as an unusable block.

In some embodiments, the processor enables program-verification for a memory block, and if that memory block fails after a subsequent programming, the processor marks it as an unusable block. In some embodiments, the processor manages stripes of memory blocks across multiple planes so that memory blocks having program-verification enabled and memory blocks having program verification disabled are assigned to different stripes. In an embodiment, as the number of memory blocks with program-verification enabled increases (e.g., above a predefined number), the processor may decide to enable program-verification to all of the memory blocks so as to avoid managing the separate types of stripes. In some embodiments, the memory device supports enable/disable program-verification at a page or word line granularity.

Following step 132 the processor loops back to step 104.

Based on the analysis of step 120 above, processor 48 may distinguish between a defective memory block failure type and the under-programming failure type (at step 124) in various ways as described herein.

In general, a defective memory block may contain word lines in which many of the memory cells cannot be programmed or erased properly. As a result, a large number of bits in the read data page will have a same logical value ('0' or '1'). Typically, a defective memory block contains multiple word lines that cannot be programmed or erased properly. In some embodiments, the processor determines that a memory block is defective with high probability when a data page read from the memory block is undecodable (or multiple data pages read are undecodable). When the memory block not found defective, the processor may determine that under-programming has occurred when the number of errors exceeds a predefined number.

In an embodiment, the memory cells in the group belong to a common word line, and the processor is configured to read from the memory cells multiple code words that were encoded before storage using ECC 50 (of memory controller 40 in FIG. 1 above). The processor identifies that the memory cells in the group belong to a defective memory block when detecting that all of the multiple code words are undecodable or having a number of errors exceeding a predefined threshold number.

In an embodiment, processor 48 checks the number of bit-flip occurrences in the read data, which is decodable. A bit-flip event means that the actual bit value read is '0' instead of the correct value '1', or '1' instead of the correct value '0'. For example, processor 48 compares the data retrieved from the memory device to the decoded version of this data and counts the number of differences between the two. A large (or medium) number of bit-flip occurrences relative to the number of errors that ECC 50 can correct may be indicative that reading the memory cells is likely to have failed because the memory cells were under-programmed. Thus, the processor identifies that the memory cells were under-programmed when the number of the bit-flip occurrences exceeds a first predefined number, and identifies that the memory cells in the group belong to a defective memory block when the number of the bit-flip occurrences exceeds a second predefined number larger than the first predefined number. Consider, for example, using an ECC 50 that can correct up to 500 bit-flip occurrences (errors). In this case, when the number of bit-flips is between N1 and N2, e.g., N1=30 and N2=300, the cause of these errors is under-programming, with high probability. When the number of bit-flips is above N3 (N3≥N2), the errors are likely caused due to a defect. In some embodiments, the processor identifies an under-programming condition based on the number of bit-flips from '0' to '1'. This type of errors is typical to under-programming and therefore using it may be more accurate than taking into consideration bit-flips in both directions.

In some embodiments, the processor reads the data page (s) multiple times using multiple different read thresholds. Using the multiple readouts, the processor estimates a histogram of the threshold voltage distribution. The processor may determine under-programming, e.g., by detecting that the tail of the histogram extends well below the program verification level (e.g., below V_VRF or V_RD in FIG. 2).

In another embodiment, the criterion for deciding on the failure type is based on a balance measure between the numbers of bits having respective bit-values '1' and '0'. In this embodiment, the processor counts in the read data a first number of one-valued bits and a second number of zero-valued bits. Processor 48 decides that the memory cells in the group belong to a defective memory block when a suitable balance measure between the first number and the second number exceeds a predefined balance threshold. For example, the processor calculates the balance measure as the ratio between the first number and the second number, and when the balance is severe (e.g., the ratio is lower than 0.7 or higher than 1.3), the processor decides that reading the memory cells is likely to have failed because of a defective memory block.

In yet another embodiment, processor 48 estimates a threshold-voltage distribution, e.g., by reading the memory cells in the group using multiple read thresholds. The processor may represent the estimated threshold-voltage distribution as a histogram. The processor identifies that the memory cells in the group were under-programmed, when identifying two distinct peaks in the estimated threshold-voltage distribution. The two peaks are assumed to correspond to the two programming levels in SLC mode. Alternatively or additionally, the processor may identify under-programming when the tail of the histogram extends well below the program verification level (e.g., V_VRF in FIG. 2).

When all of the data pages in a memory block fail reading, the memory block is likely to be defective. On the other hand, when only a partial subset of the pages in the memory block fail reading, the read failures are likely to be caused due to under-programming. Consider for example a word line that stores multiple code words. When under-programming occurs, the memory cells storing the code words will typically be under-programmed, with high probability. The severity level of under-programming may differ among the code words. For example, it is possible that only one of the code words is undecodable or has an excessive number of errors. When all of the code words in a word line are found undecodable, it is more likely caused by a defect rather than under-programming. In some embodiments, the processor identifies data pages that failed reading in a same memory block and identifies that the memory cells in the group were under-programmed when the number of the failing data pages in the same memory block is below a predefined number.

In some embodiments, the memory blocks of the memory device are organized in multiple planes, which the processor can access in parallel. When program-verify is disabled, a read failure occurring in only one plane, is likely to be caused by a defective memory block in that plane. On the other hand, when read failures (undecodable code words or a high number of errors occur in all planes, it is more likely to be cased due to under-programming In an embodiment, processor 48 programs data to a group of memory cells (e.g., a WL) across the multiple planes in parallel, and at a later time reads the data from the group of memory cells in the multiple planes. The processor determines that part the memory cells in the group belong to a defective memory block in a respective plane, when reading the data fails only in the respective memory block among the multiple planes.

Selective Blind SLC Programming

Figure 4:
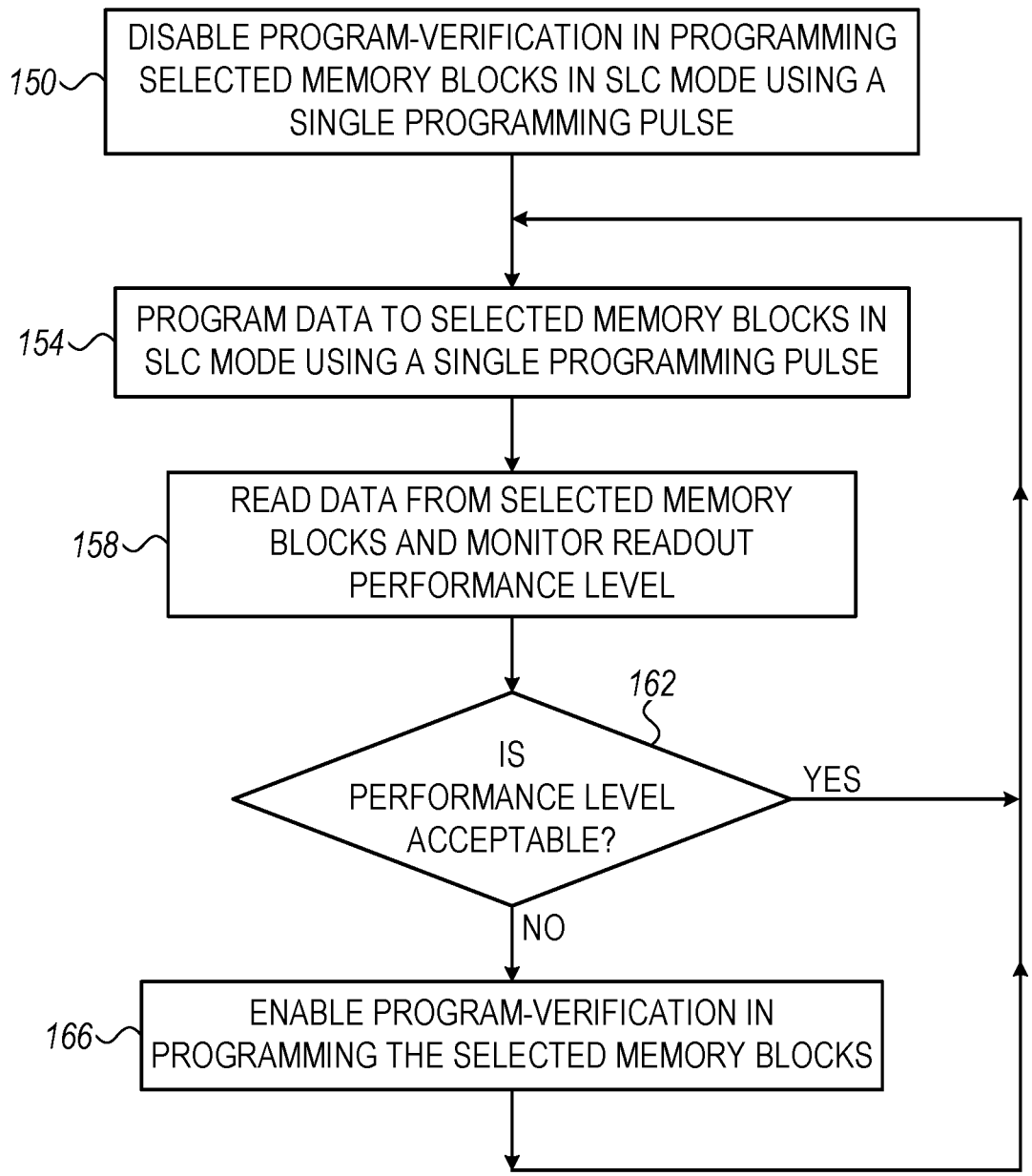
FIG. 4 is a flow chart that schematically illustrates a method for selective blind SLC programming, in accordance with an embodiment that is described herein.

FIG. 4 is a flow chart that schematically illustrates a method for selective blind SLC programming, in accordance with an embodiment that is described herein.

In describing the method, multiple selected memory blocks are assumed to be programmed in blind SLC mode. Moreover, the selected memory blocks are assumed to be functional (e.g., not yet retired as unusable memory blocks), but may suffer under-programming. Distinguishing between defect memory blocks and those that were under-programmed may be performed, for example, using the method of FIG. 3 above.

The method begins at a verification disabling step 150, with processor 48 disabling program-verification in programming selected memory blocks in SLC mode using a single programming pulse.

At a programming step 154, the processor programs data to the selected memory blocks in SLC mode using a single programming pulse. The program operation at this point is carried out without performing program-verification.

At a reading step 158, the processor reads data from the selected memory blocks, and monitors the readout performance level. The processor may evaluate the performance level in various ways. In an embodiment, the processor may evaluate the performance level by estimating the read failure rate. In another embodiment, the processor measures the number of erroneous bits or Bit Error Rate (BER). The processor may assign a performance level, e.g., for each of the selected memory blocks separately, or to multiple selected memory blocks collectively.

At a performance query step 162, processor 48 checks whether the performance level is acceptable, e.g., by comparing the performance level evaluated at step 158 to a predefined performance threshold. When the performance level is acceptable, the processor loops back to step 154 to continue programming the selected memory blocks. Otherwise, the performance level is unacceptable, and the processor proceeds to a verification enabling step 166. At step 166 the processor enables program-verification in subsequent program operations in SLC mode to the selected memory blocks.

Following step 166 the processor loops back to step 154 to program data to the selected memory blocks. At this point the programming includes verification.

In the method of FIG. 4, program-verification is initially disabled, for fast writing. When the read performance degrades, program-verification is selectively enabled in memory blocks in which the performances becomes unacceptable. In these memory blocks, writing rate will be slowed down due to the program-verification, but readout reliability increases.

Managing Stripes of Memory Blocks

In some embodiments, the memory cells are arranged in multiple planes, and the memory controller can perform a multi-plane operation that accesses multiple memory blocks in respective planes in parallel. Memory blocks that are accessed in parallel are belonging to a common stripe. Note that the program time of a stripe is determined by the slowest memory block in the stripe. Therefore, program-verification enabled or disabled should be configured to all of the memory blocks of a stripe.

Figure 5:
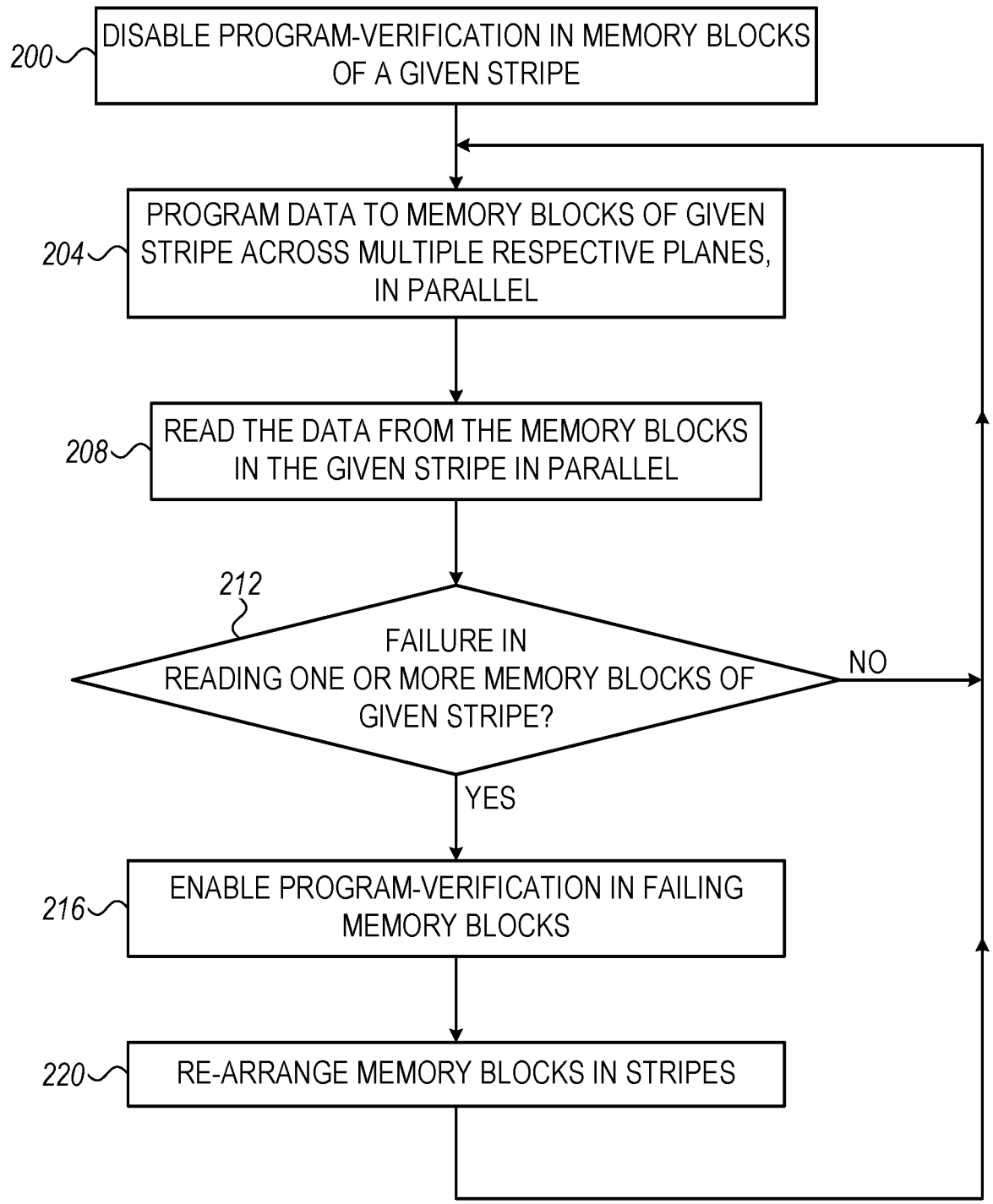
FIG. 5 is a flow chart that schematically illustrates a method for managing stripes of memory blocks in multi-plane programming in SLC mode using a single programming pulse, in accordance with an embodiment that is described herein.

FIG. 5 is a flow chart that schematically illustrates a method for managing stripes of memory blocks in multi-plane programming in SLC mode using a single programming pulse, in accordance with an embodiment that is described herein.

In some embodiments, data stored in SLC mode using a single programming pulse is protected using a suitable RAID scheme, e.g., a plane-level RAID scheme that uses one block of a stripe to store redundancy data for recovering a failing memory block in the stripe.

The method begins with processor 48 disabling program-verification in memory blocks of a given stripe, at a disabling step 200. At a programming step 201, the processor programs data to the memory blocks of the Given stripe across multiple respective planes, in parallel. The memory controller may program the memory blocks in parallel using a multi-plane programming command.

At a reading step 208, processor 48 reads the data from the memory blocks in the given stripe in parallel, e.g., using a multi-plane read command. At a failure checking step 212, processor 48 checks whether a read failure occurred in one or more of memory blocks of the given stripe, and if not, loops back to step 204 to perform subsequent multi-program operations to the given stripe (and/or to other stripes). Otherwise, the processor proceeds to a program-verification enabling step 216, at which the processor enables program-verification in the memory blocks in which the read operation has failed. This may slow down the programming throughput by a factor of two, but is typically more efficient than recovering failing memory blocks using the RAID scheme.

At a re-arranging step 220, processor 48 rearranges memory blocks into stripes so that the memory blocks in each stripe are all configured to program-verification enabled or disables. For example, the processor assigns the memory blocks whose program-verification was enabled at step 216 to another stripe whose memory blocks are all configured to program-verification enabled. The processor may additionally assign memory blocks whose program-verification is still disabled to the given stripes. Following step 216, the processor loops back to step 204.

In some embodiments, instead of steps 216 and 220, processor 48 enables program-verification in all of the memory blocks of the given stripe.

The embodiments described above are given by way of example, and other suitable embodiments can also be used. For example, although that embodiments described above refer mainly to NAND-based nonvolatile memory devices, the embodiments are similarly applicable to other suitable storage technologies that support programming in SLC mode.

In general, the disclosed embodiments are applicable in any nonvolatile memory system that supports SLC mode and enable/disable program-verification and that stores data encoded with a suitable ECC. Such a memory system may employ a suitable RAID scheme for recovering data lost in failing read operations.

Although the embodiments described herein mainly address programming in SLC mode using a single programming pulse with no verification, methods and systems described herein can also be used in other applications, such as in MLC devices for avoiding program-verification for the highest programming level.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A controller, comprising:
   an interface configured to communicate with a memory device comprising multiple memory cells organized in memory blocks, the memory device supporting programming of the memory cells with enabled or disabled program-verification operation that, when enabled, verifies that selected memory cells being programmed have reached respective predefined thresholds; and
   a processor configured to:
   disable the program-verification operation and program data to a group of the memory cells in a Single Level Cell (SLC) mode using a single programming pulse;
   after concluding programming of the data using the single programming pulse with the program-verification operation disabled, read the data from the group of the memory cells;
   in response to detecting a failure in reading the data, distinguish between (i) whether the memory cells in the group belong to a defective memory block and (ii) whether the memory cells in the group were under-programmed by the single programming pulse; and
   when identifying that the memory cells in the group were under-programmed, perform a corrective action to prevent under-programming in subsequent program operations to the memory cells in the group.

2. The controller according to claim 1, wherein the processor is configured to check a number of bit-flip occurrences in the read data, to identify that the memory cells were under-programmed when the number of the bit-flip occurrences exceeds a first predefined number, and to identify that the memory cells in the group belong to a defective memory block when the number of the bit-flip occurrences exceeds a second predefined number larger than the first predefined number.

3. The controller according to claim 1, wherein the processor is configured to count in the read data a first number of one-valued bits and a second number of zero-valued bits, and to identify that the memory cells in the group belong to a defective memory block when a balance measure between the first number and the second number exceeds a predefined balance threshold.

4. The controller according to claim 1, wherein the processor is configured to estimate a threshold-voltage distribution by reading the memory cells in the group using multiple read thresholds, and to identify that the memory cells in the group were under-programmed when identifying two distinct peaks in the estimated threshold-voltage distribution.

5. The controller according to claim 1, wherein the processor is configured to identify pages that failed reading in a same memory block, and to identify that the memory cells in the group were under-programmed when a number of the failing pages in the same memory block is below a predefined number.

6. The controller according to claim 1, wherein the memory blocks are organized in multiple planes, and wherein the processor is configured to:
program the data across the multiple planes in parallel;
read the data from the group of memory cells in the multiple planes; and
identify that part of the memory cells in the group belong to a defective memory block in a respective plane, when reading the data fails only in the respective plane among the multiple planes.

7. The controller according to claim 1, wherein the processor is configured to read from the memory cells in the group multiple code words that were encoded before storage in accordance with an Error Correction Code (ECC), and to identify that the memory cells in the group belong to a defective memory block when detecting that all of the multiple code words are undecodable or having a number of errors exceeding a predefined threshold number.

8. The controller according to claim 1, wherein the processor is configured to perform the corrective action by enabling the program-verification operation in subsequent program operations to the memory cells in the group.

9. The controller according to claim 1, wherein the processor is configured to perform the corrective action by increasing an amplitude of the single programming pulse in subsequent program operations to the memory cells in the group.

10. The controller according to claim 1, wherein in response to identifying that the memory cells in the group were under-programmed, the processor is configured to estimate a severity level of under-programming applied to the memory cells in the group, and to select the corrective action from among multiple predefined corrective action tasks, based on the severity of the under-programming.

11. The controller according to claim 1, wherein the processor is configured to estimate a failure rate in reading data from the group of the memory cells, and upon detecting that the failure rate exceeds a predefined rate, to enable the program-verification operation in subsequent program operations to the memory cells in the group.

12. The controller according to claim 1, wherein the memory cells in the group belong to a stripe comprising multiple memory blocks in multiple respective planes, wherein the processor is configured to:
read the memory cells in the group across the multiple memory blocks of the stripe; and
upon detecting a failure in reading the memory cells in a given memory block, assign the given memory block to a stripe in which the memory cells are programmed with the program-verification operation enabled.

13. A method for data storage, comprising:
in a controller that communicates with a memory device comprising multiple memory cells organized in memory blocks, the memory device supports programming the memory cells with enabled or disabled program-verification operation that, when enabled, verifies that selected memory cells being programmed have reached respective predefined thresholds,
disabling the program-verification operation, and program data to a group of the memory cells in a Single Level Cell (SLC) mode using a single programming pulse;
after concluding programming of the data using the single programming pulse with the program-verification operation disabled, reading the data from the group of the memory cells;
in response to detecting a failure in reading the data, distinguishing (i) whether the memory cells in the group belong to a defective memory block and (ii) the memory cells in the group were under-programmed by the single programming pulse; and
when identifying that the memory cells in the group were under-programmed, performing a corrective action to prevent under-programming in subsequent program operations to the memory cells in the group.

14. The method according to claim 13, and comprising checking a number of bit-flip occurrences in the read data, identifying that the memory cells were under-programmed when the number of the bit-flip occurrences exceeds a first predefined number, and identifying that the memory cells in the group belong to a defective memory block when the number of the bit-flip occurrences exceeds a second predefined number larger than the first predefined number.

15. The method according to claim 13, and comprising counting in the read data a first number of one-valued bits and a second number of zero-valued bits, and identifying that the memory cells in the group belong to a defective memory block when a balance measure between the first number and the second number exceeds a predefined balance threshold.

16. The method according to claim 13, and comprising estimating a threshold-voltage distribution by reading the memory cells in the group using multiple read thresholds, and identifying that the memory cells in the group were under-programmed when identifying two distinct peaks in the estimated threshold-voltage distribution.

17. The method according to claim 13, and comprising identifying pages that failed reading in a same memory block, and identifying that the memory cells in the group were under-programmed when a number of the failing pages in the same memory block is below a predefined number.

18. The method according to claim 13, wherein the memory blocks are organized in multiple planes, and comprising:
programing the data across the multiple planes in parallel;
reading the data from the group of memory cells in the multiple planes; and identifying that part of the memory cells in the group belong to a defective memory block in a respective plane, when reading the data fails only in the respective plane among the multiple planes.

19. The method according to claim 13, and comprising reading from the memory cells in the group multiple code words that were encoded before storage in accordance with an Error Correction Code (ECC), and identifying that the memory cells in the group belong to a defective memory block when detecting that all of the multiple code words are undecodable or having a number of errors exceeding a predefined threshold number.

20. The method according to claim 13, wherein performing the corrective action comprises enabling the program-verification operation in subsequent program operations to the memory cells in the group.

21. The method according to claim 13, wherein performing the corrective action comprises increasing an amplitude of the single programming pulse in subsequent program operations to the memory cells in the group.

22. The method according to claim 13, wherein performing the corrective action comprises, in response to identifying that the memory cells in the group were under-programmed, estimating a severity level of under-programming applied to the memory cells in the group, and selecting the corrective action from among multiple predefined corrective action tasks, based on the severity of the under-programming.

23. The method according to claim 13, and comprising estimating a failure rate in reading data from the group of the memory cells, and upon detecting that the failure rate exceeds a predefined rate, enabling the program-verification operation in subsequent program operations to the memory cells in the group.

24. The method according to claim 13, wherein the memory cells in the group belong to a stripe comprising multiple memory blocks in multiple respective planes, wherein the method further comprising,
- reading the memory cells in the group across the multiple memory blocks of the stripe; and
- upon detecting a failure in reading the memory cells in a given memory block, assigning the given memory block to a stripe in which the memory cells are programmed with the program-verification operation enabled.

\* \* \* \* \*